United States Patent [19]

Takeuchi et al.

[11] Patent Number: 4,720,674

[45] Date of Patent: Jan. 19, 1988

[54] DOPPLER SIGNAL ANALYZING APPARATUS

[75] Inventors: Yasuhito Takeuchi; Shinichi Sano; Takao Jibiki; Takao Higashiizumi, all of Tokyo, Japan

[73] Assignee: Yokogawa Medical Systems, Limited, Tokyo, Japan

[21] Appl. No.: 841,522

[22] Filed: Mar. 10, 1986

[30] Foreign Application Priority Data

Jul. 20, 1984 [JP] Japan ................... 59-150880
Jul. 19, 1985 [WO] PCT Int'l Appl. ... PCT/JP85/00410

[51] Int. Cl.$^4$ ............................................. G01R 23/16
[52] U.S. Cl. ..................... 324/77 B; 324/77 E
[58] Field of Search ............. 324/77 B, 77 D, 77 E, 324/78 F, 78 E; 364/484, 485

[56] References Cited

U.S. PATENT DOCUMENTS 3,842,384  7/1974  Murata et al. ................ 235/156

FOREIGN PATENT DOCUMENTS 0113275  7/1984  European Pat. Off. .
0202173  5/1985  Japan ................... 324/77 B

OTHER PUBLICATIONS

A Measurement Technique for L-F, R. Murthy et al., J. Phys: Sci Instum., vol. 12, 1979.
Simple Spectrum Analyzer for Low and Infra low Frequencies, V. M. Zhestovski et al, Instum & Exp Tech., No. 2, Mar. 1970.
A Low Frequency Spectrum Analyzer, Hewlett & Packard J. (U.S.A) vol. 23, No. 1, Sep. 1971.

Primary Examiner—Michael J. Tokar
Assistant Examiner—Louis M. Arana
Attorney, Agent, or Firm—Moonray Kojima

[57] ABSTRACT

A Doppler signal analyzing apparatus is capable of frequency analysis of a Doppler signal with frequency and time resolutions that match the frequency band of a signal to be analyzed. The signal to be analyzed is divided into a plurality of frequency bands by bandpass means ($10_1$, $10_2$, $10_3$), and signals in the frequency bands which have passed through the bandpass means are acquired by signal acquiring means (11) over time slots that are smaller for higher-frequency signals and larger for lower-frequency signals. The signals acquired by the signal acquiring means are subjected to a Fourier transform by Fourier transform means (14).

3 Claims, 3 Drawing Figures

DOPPLER SIGNAL ANALYZING APPARATUS

TECHNICAL FIELD

The present invention relates to a Doppler signal analyzing apparatus for use in an ultrasonic CW Doppler system or a pulse Doppler system, and more particularly to such a Doppler signal analyzing apparatus in which the frequency resolution and time resolution of analyzed results are optimized according to the frequency band of a Doppler signal.

BACKGROUND ART

Conventional Doppler signal frequency analysis is carried out with both of a frequency slot width and a time slot width being fixed. Since the frequency and time slot widths determine frequency and time resolutions, respectively, of the frequency analysis, these frequency and time resolutions are also fixed in the conventional frequency analysis. The frequency and time slot widths are reciprocals of each other so that if one of these slot widths is reduced, then the other slot width is increased, and so are the frequency and time resolutions.

Doppler signal frequency analysis serves to analyze a Doppler signal obtained over a time period corresponding to the time slot width. Therefore, a delay is caused over the time corresponding to the time slot width before analyzed results are produced. For example, if the frequency slot width is 50 Hz and the time slot width is 20 msec. as with a typical example in a medical ultrasonic Doppler system, then the delay time is 20 msec. The time resolution is also 20 msec. since the time slot width is the same as the time resolution. Where the ultrasonic Doppler system is employed for heart diagnosis, the results of frequency analysis of the Doppler signal are displayed or recorded simultaneously with an M-mode ultrasonic image and an electrocardiogram or a phonocardiogram for mutual comparison. Although the M-mode ultrasonic image and the electrocardiogram or phonocardiogram are produced without any substantial time delay and with a high time resolution, the results of Doppler signal frequency analysis are obtained with a time delay of 20 msec., for example, and a coarse time resolution. Therefore, it is not suitable for such analyzed results to be used for comparison with the M-mode ultrasonic image and the electrocardiogram.

In order to reduce the time delay and increase the time resolution, the time slot width should be reduced. However, when the time slot width is reduced, the frequency slot width is to be increased, resulting in a lowered frequency resolution. As a result, the accuracy of frequency analysis becomes lower in a lower frequency band.

The fixed frequency and time slot widths cannot therefore meet contradictory requirements for the frequency resolution and the time resolution or the time delay.

DISCLOSURE OF THE INVENTION

It is an object of the present invention to provide a Doppler signal analyzing apparatus capable of frequency analysis which matches the frequency band of a Doppler signal.

According to the present invention, a Doppler signal analyzing apparatus divides a signal to be analyzed into a plurality of frequency bands with bandpass means ($10_1$, $10_2$, $10_3$), and signals in the frequency bands which have passed through the bandpass means are acquired by signal acquiring means (11) over time slots that are smaller for higher-frequency signals and larger for lower-frequency signals. The signals acquired by the signal acquiring means are subjected to a Fourier transform by Fourier transform means (14).

BEST MODE FOR CARRYING OUT THE INVENTION

An embodiment of the present invention will hereinafter be described with reference to the drawings.

Figure 1:
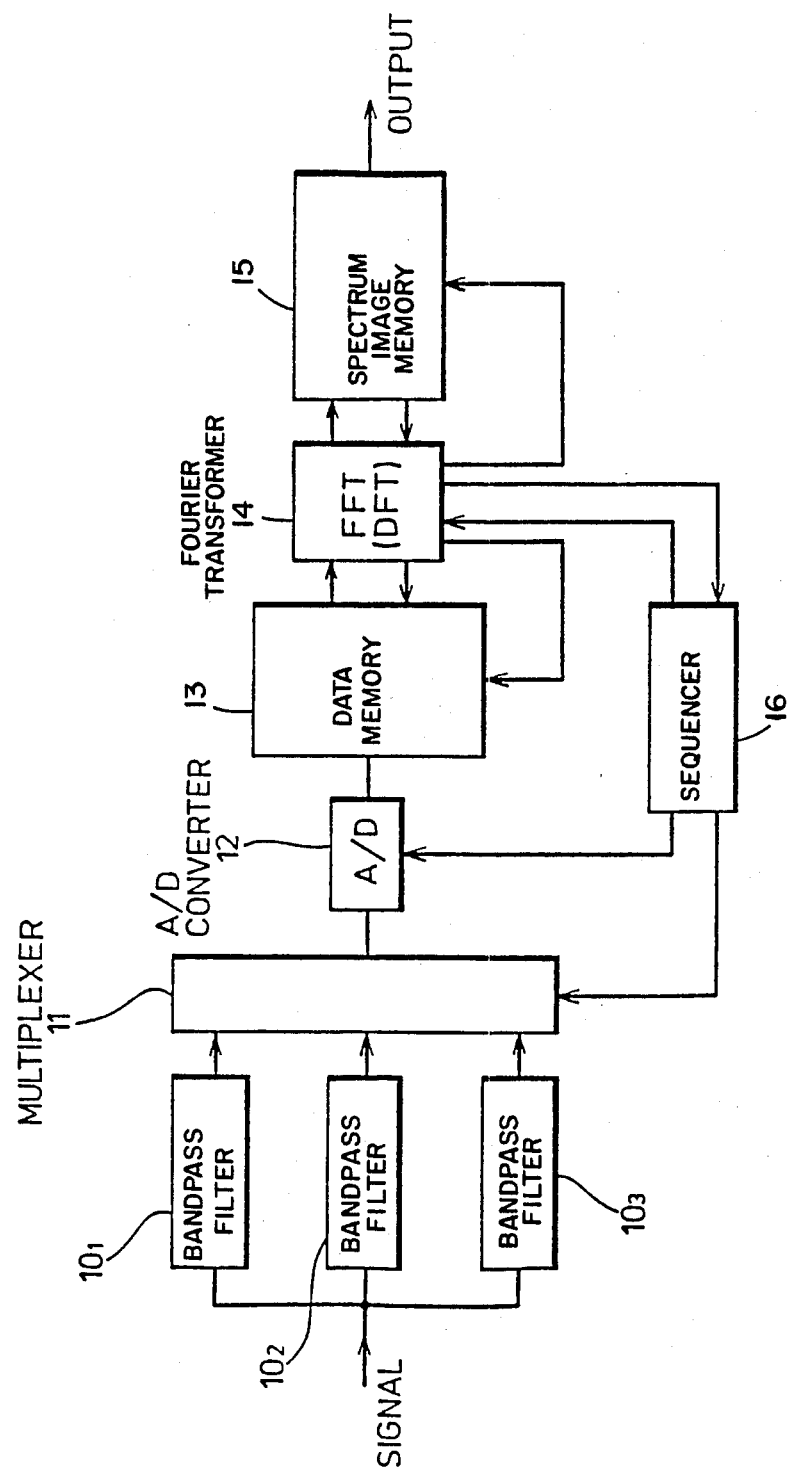
FIG. 1 is a block diagram of an embodiment of the present invention.

Designated in FIG. 1 at $10_1$, $10_2$, $10_3$ are bandpass filters, 11 a multiplexer, 12 an analog-to-digital converter (hereinafter referred to as an "A/D converter"), 13 a data memory, 14 a Fourier transformer (FFT or DFT), 15 a spectrum image memory, and 16 a sequencer.

The bandpass filters $10_1$, $10_2$, $10_3$ have passbands of 12.5 through 100 Hz (low band), 100 through 800 Hz (middle band), and 800 Hz to 6.4 KHz (high band), respectively. A signal to be analyzed is applied to these bandpass filters. Output signals from the bandpass filters are selected, one at a time, by the multiplexer 11, and converted by the A/D converter 12 to digital data which is then stored in the data memory 13.

The frequency slot width and the time slot width for the output signal from the bandpass filter $10_1$ are selected to be 6.25 Hz and 160 msec., respectively, in order to gain low-frequency signals by placing more importance on the frequency resolution than on the time resolution. The frequency slot width and the time slot width for the output signal from the bandpass filter $10_2$ are selected to be 50 Hz and 20 msec., respectively, in order to gain middle-frequency signals with moderate frequency and time resolutions. The frequency slot width and the time slot width for the output signal from the bandpass filter $10_3$ are selected to be 400 Hz and 2.5 msec., respectively, in order to gain high-frequency signals including phenomena that happen highly frequently by placing more importance on the time resolution than on the frequency resolution.

The multiplexer 11 samples an equal number of data items during the period of each time slot from the signals in the respective time slots. The number of such data items is determined by the number of inputs and outputs of the Fourier transformer 14, the number of data items being 32 for example. The sampling rates of the multiplexer 11 for the output signals from the bandpass filters $10_1$, $10_2$, $10_3$ are determined as 200 Hz, 1.6 kHz, and 12.8 kHz, respectively, so as to sample 32 data items from each of the output signals of the bandpass filters $10_1$, $10_2$, $10_3$ during the respective time slots 160 msec., 50 msec., and 2.5 msec.

The above relationship is shown in the table 1.

TABLE 1

| | Frequency band | Frequency slot width | Time slot width | Sampling rate |
|---|---|---|---|---|
| Low frequencies | 12.5–100 Hz | 6.25 Hz | 160 msec | 200 Hz |
| Middle frequencies | 100–800 Hz | 50 Hz | 20 msec | 1.6 kHz |
| High frequencies | 800 Hz–6.4 kHz | 400 Hz | 2.5 msec | 12.8 kHz |

The timing of the signal sampling by the multiplexer 11 and the A/D conversion by the A/D converter 12 is controlled by the sequencer 16 in order to achieve the sampling rates as shown in the table 1.

Figure 2:
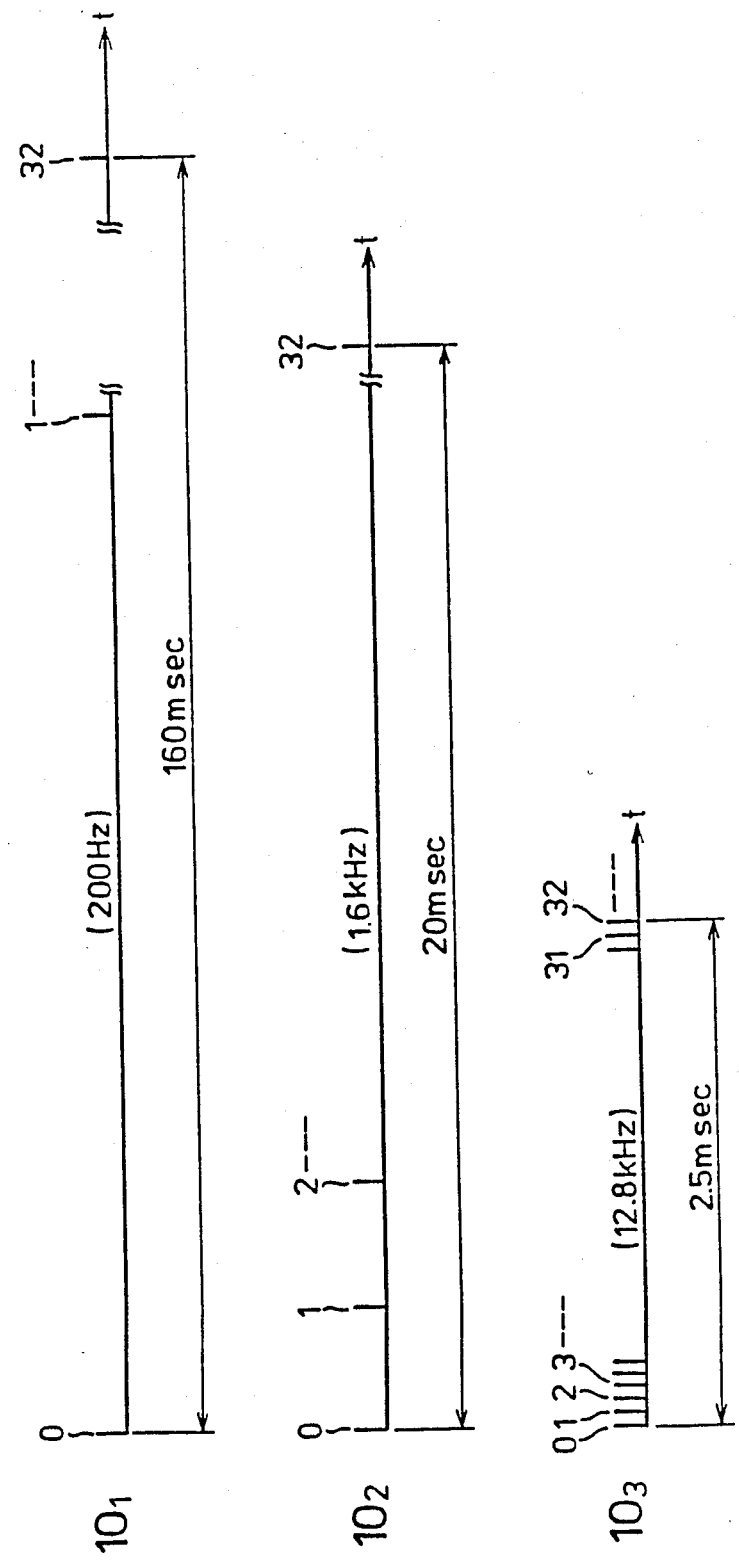
FIG. 2 is a timing chart of operation of the embodiment of FIG. 1.

One example of the timing of the data sampling and the A/D conversion for each of the bandpass filters $10_1$, $10_2$, $10_3$ is illustrated in FIG. 2.

Figure 3:
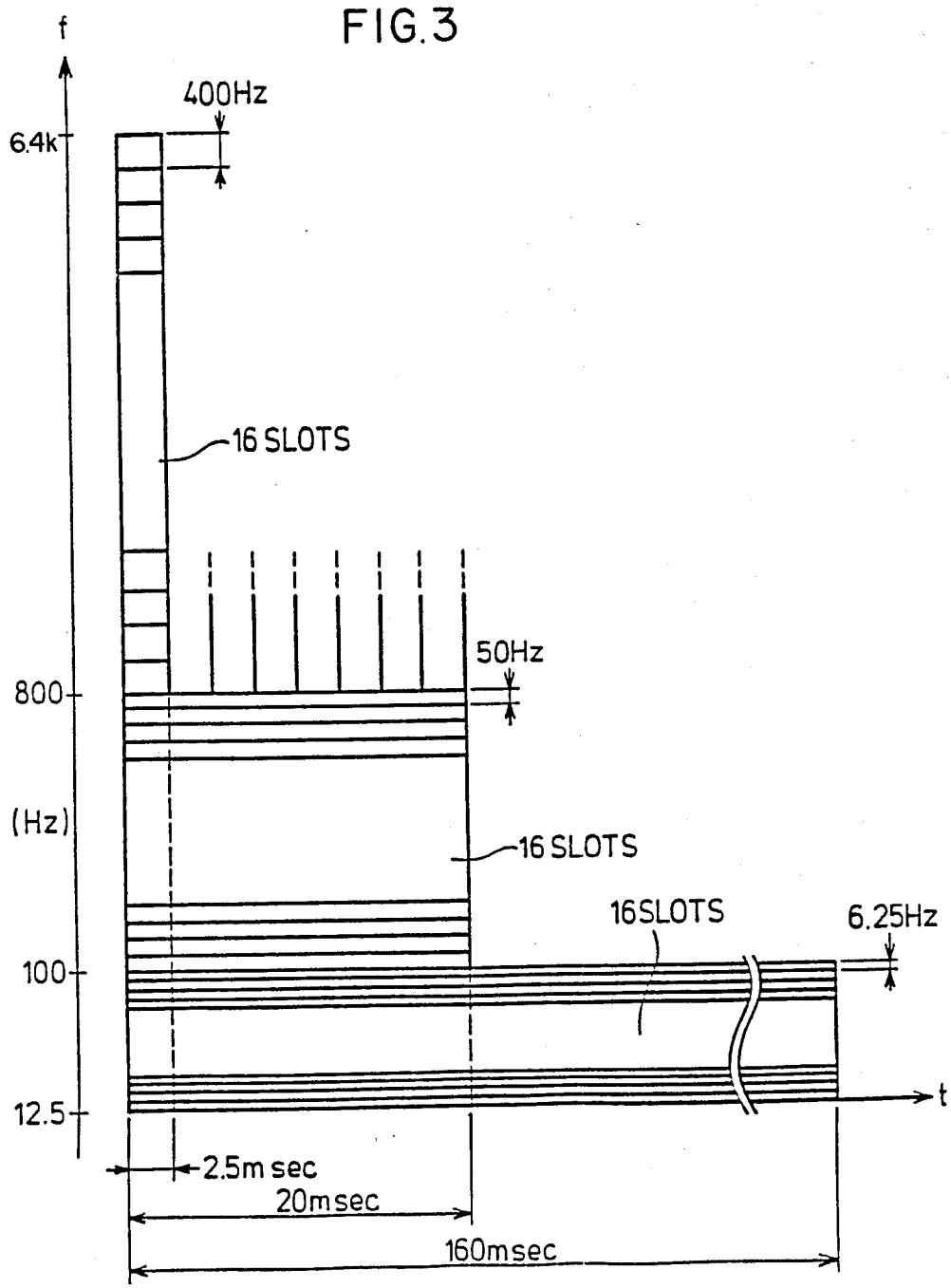
FIG. 3 is a diagram of a bit map in a spectrum image memory in the embodiment of FIG. 1.

The data items which are sampled by the multiplexer 11 and converted by the A/D converter 12 to digital signals are stored in the data memory 13 for the respective bandpass filters $10_1$, $10_2$, $10_3$. Each time 32 data items from a bandbass filter are stored in the data memory 13, the Fourier transformer 14 effects a Fourier transform and writes a spectrum image formed thereby into the memory 15. It is easy to perform the Fourier transform within 2 msec. by using the FFT algorithm. A bit map as shown in FIG. 3 is formed in the spectrum image memory 15. The bit map has a horizontal axis representing time and a vertical axis representing frequencies, and contains frequency and time slot groups in the respective frequency bands. In this bit map, the frequency and time slot groups for high frequencies repeatedly appear in each 2.5 msec. in the direction of the time axis, those for middle frequencies repeatedly appear in each 20 msec. in the direction of the time axis, and those for low frequencies repeatedly appear in each 160 msec. in the direction of the time axis.

The analyzed results for high frequencies are written in the bit map in each 2.5 msec., those for middle frequencies are written in the bit map in each 20 msec., and those for low frequencies are written in the bit map in each 160 msec. By reading out the spectrum image stored in the bit map for display or recording, the high frequency components are displayed or recorded at the time resolution of 2.5 msec. Such display or recording is practically sufficient for analyzing the heart function and the blood stream condition. The visual line speed in a human body from which a doppler shift in the high frequency range derives is in the range of from 1.4 m/sec. to 17.5 cm/sec. assuming that the carrier frequency (ultrasonic frequency in this case) is 3.5 MHz, and is enough for the observation of normal human artery blood streams. Although the frequency resolution of 400 Hz is coarse, it is in an acceptable range since the frequencies in question are high and it is practically sufficient to be capable of distinguishing between a unidirectional flow and a turbulence such as a vortex for a high-speed blood stream. The frequency and time slot widths for the middle frequency band are suitable for analyzing slower vein blood and lymph streams. The time resolution of 20 msec. is sufficient for such a range of flow speeds because phenomena that happen highly frequently are not required to be analyzed. The frequency and time slot widths for the low frequency band are suitable for analyzing much slower body movements, organ movements, and respiration, for example. The frequency resolution of 6.25 Hz is appropriate for observing such slow movements, and the time resolution of 160 msec. is sufficiently in an acceptable range as the frequency of occurences of phenomena is further lowered. For the high and middle frequency bands, analyzed outputs overlapping those in the respective lower frequency bands are produced as a result of FFT or DFT. However, these overlapping outputs are not utilized.

The frequency bands for a signal to be analyzed are not limited to three frequency bands, but may be greater or smaller frequency bands.

Although the best mode of carrying out the invention has been described, it should be understood that various changes and modifications may be made therein without departing from the concept of the invention represented by the appended claims.

We claim:

1. A doppler signal analyzing apparatus for acquiring a signal to be analyzed for a prescribed time slot and then for performing a Fourier transform on the acquired signal with Fourier transform means to determine a frequency spectrum of the signal to be analyzed, said apparatus comprising bandpass means ($10_1$, $10_2$, $10_3$) for dividing the signal to be analyzed into a plurality of frequency bands, said bandpass means comprising a first bandpass filter for passing a first frequency band of 12.5 to 100 Hz, a second bandpass filter for passing a second frequency band of 100 to 800 Hz, and a third bandpass filter for passing a third frequency band of 800 Hz to 6.4 kHz;

signal acquiring means (11) for acquiring signals in the frequency bands which have passed through said first bandpass filter over a time slot of 160 msec for 6.25 Hz, through said second bandpass filter over a time slot of 20 msec for 50 Hz, and through said third bandpass filter over a time slot of 2.5 msec for 400 Hz, said signal acquiring means comprising a multiplexer for selecting, one at a time, signals in said first, second and third frequency bands which have passed through said first, second and third bandpass filters, respectively, said multiplexer having inputted thereto 32 data items during the respective time slots for said first, second and third bandpass filters, and generating output signals;

Fourier transform means (14) for carrying out a Fourier transform on each of the signals acquired by said signal acquiring means;

an analog-to-digital converter (12) for converting and outputting said output signals from said multiplexer succesively to digital signals;

a data memory (13) for storing said digital signals from said analog-to-digital converter in respective first, second and third frequency bands for the signal to be analyzed, wherein said Fourier transform means effects Fourier transform on said 32 data items in respective first, second and third frequency bands stored in said data memory; and a spectrum memory (15) for recording an output signal from said Fourier transform means as bit maps each 2.5 msec for the signals from said first bandpass filter, each 20 msec for the signals from said second bandpass filter and each 160 msec for the signals from said third bandpass filter.

2. A Doppler signal analyzing apparatus according to claim 1, wherein said Fourier transform means comprises an FFT device.

3. A Doppler signal analyzing apparatus according to claim 1, wherein said Fourier transform means comprises an DFT device.

* * * * *